(12) United States Patent
Otremba

(10) Patent No.: US 8,519,545 B2
(45) Date of Patent: Aug. 27, 2013

(54) ELECTRONIC DEVICE COMPRISING A CHIP DISPOSED ON A PIN

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 309 days.

(21) Appl. No.: 12/884,793

(22) Filed: Sep. 17, 2010

(65) Prior Publication Data

US 2012/0068186 A1    Mar. 22, 2012

(51) Int. Cl.
*H01L 29/40*    (2006.01)

(52) U.S. Cl.
USPC ........... 257/776; 257/666; 257/707; 438/125; 438/126; 438/106

(58) Field of Classification Search
USPC ................ 257/776, 666, 707; 438/125, 126, 438/106
See application file for complete search history.

(56) References Cited

U.S. PATENT DOCUMENTS

| | | | | |
|---|---|---|---|---|
| 5,459,350 A * | 10/1995 | Date et al. | ..................... | 257/666 |
| 7,145,223 B2 | 12/2006 | Kunimatsu et al. | | |
| 2008/0303137 A1* | 12/2008 | Ward et al. | ..................... | 257/714 |
| 2009/0057878 A1* | 3/2009 | Gomez | ........................ | 257/706 |
| 2009/0273913 A1* | 11/2009 | Otremba | ...................... | 361/820 |

\* cited by examiner

*Primary Examiner* — Julio J Maldonado
*Assistant Examiner* — Robert Bachner
(74) *Attorney, Agent, or Firm* — Slater & Matsil, L.L.P.

(57) ABSTRACT

An electronic device includes a carrier, a plurality of pins, and an electronic circuit that includes a first semiconductor chip and a second semiconductor chip. The first semiconductor chip is attached to the carrier and the second semiconductor chip is attached to one of the plurality of pins.

27 Claims, 5 Drawing Sheets

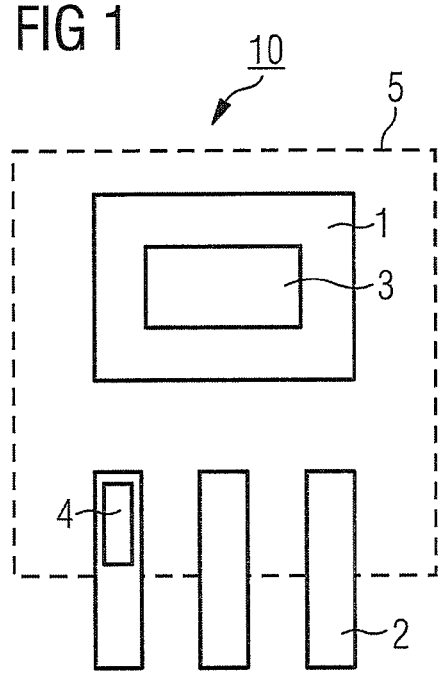
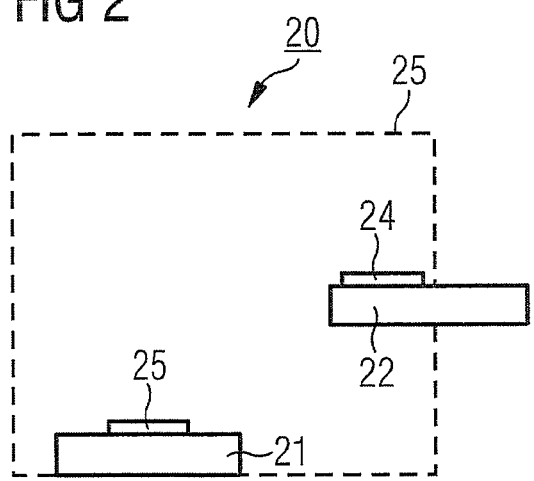

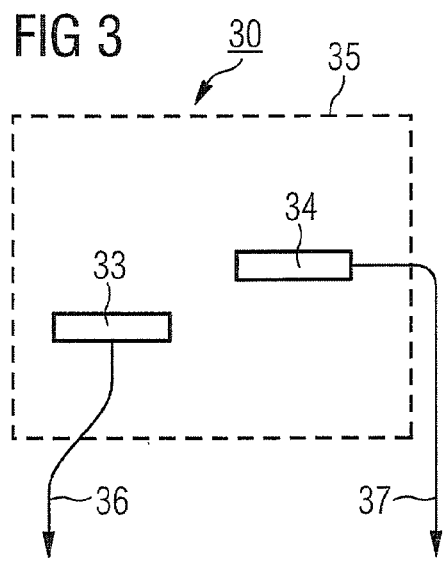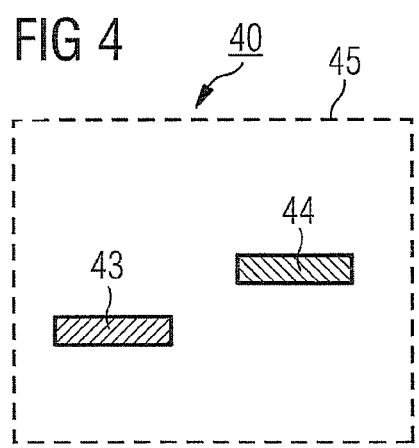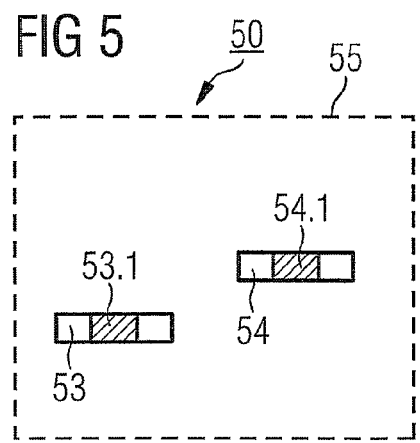

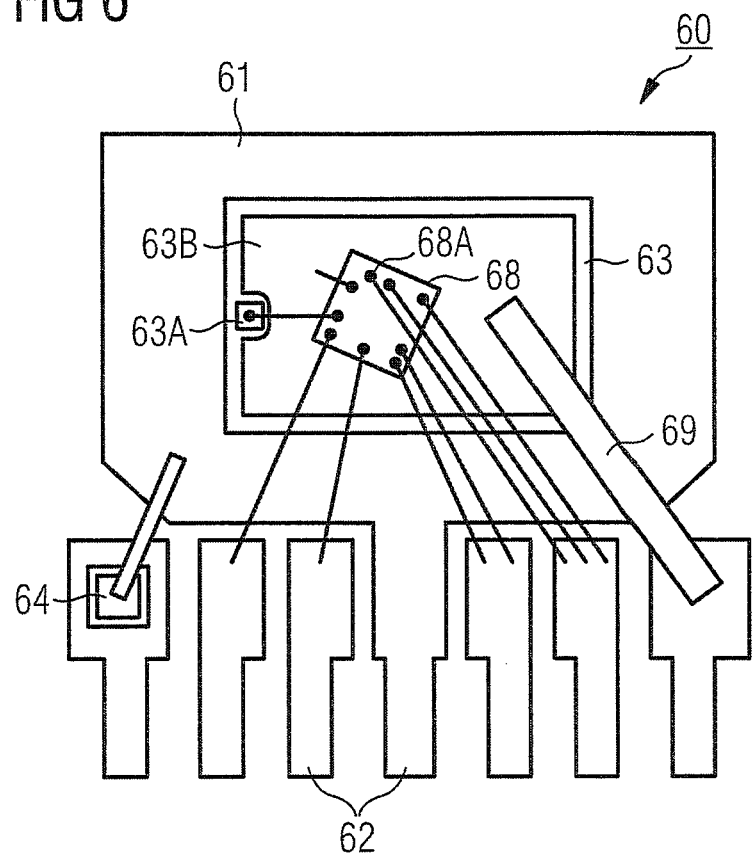

US 8,519,545 B2

ELECTRONIC DEVICE COMPRISING A CHIP DISPOSED ON A PIN

TECHNICAL FIELD

The present invention relates to an electronic device.

BACKGROUND

Electronic devices very often comprise two or more semiconductor chips accommodated within one and the same semiconductor chip package. In particular, if power semiconductor chips are employed, a general problem arises due to excessive heat produced within the semiconductor chips and the difficulty of dissipating the excessive heat. Therefore, normally if an electronic circuit includes two or more power semiconductor chips, the semiconductor chips are accommodated each within a separate semiconductor chip package in order to facilitate dissipation of excessive heat produced therein.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Aspects of the invention are made more evident in the following detailed description of embodiments when read in conjunction with the attached drawing figures, wherein:

FIG. 1 shows a schematic top view representation of an electronic device according to an embodiment;

FIG. 2 shows a schematic cross-section side view representation of an electronic device according to an embodiment;

FIG. 3 shows a schematic cross-section side view representation of an electronic device according to an embodiment;

FIG. 4 shows a schematic cross-section side view representation of an electronic device according to an embodiment;

FIG. 5 shows a schematic cross-section side view representation of an electronic device according to an embodiment;

FIG. 6 shows a schematic top view representation of an electronic device according to an embodiment;

DETAILED DESCRIPTION OF ILLUSTRATIVE EMBODIMENTS

Figure 7A:
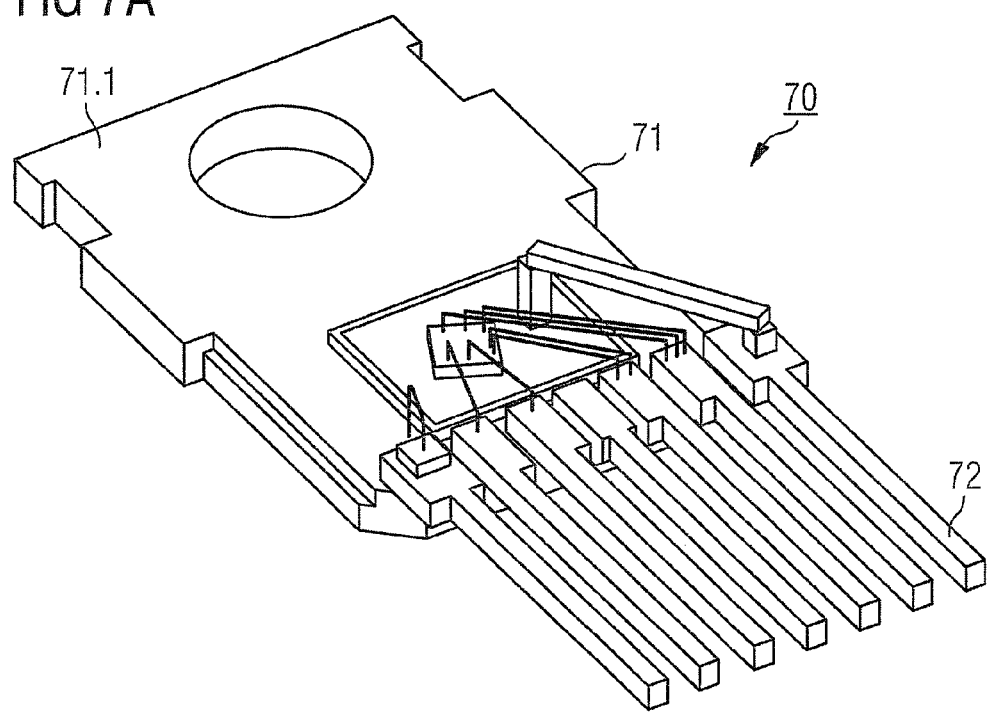
FIGS. 7A and 7B show perspective representations of an electronic device according to an embodiment.

In the following detailed description, reference is made to the accompanying drawings, which form part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The devices used there, namely semiconductor chips or semiconductor dies may comprise contact elements or contact pads on one or more of their outer surfaces wherein the contact elements serve for electrically contacting the respective device to a wireboard, for example. The contact elements may be made from any electrically conducting material, e.g., from a metal such as aluminum, gold, or copper, for example, or a metal alloy, e.g., solder alloy, or an electrically conducting organic material, or an electrically conducting semiconductor material.

The semiconductor chips will become packaged or covered with an encapsulant or insulating material. The encapsulant material can be any electrically insulating material, for example, any kind of mold material, any kind of epoxy material, or any kind of resin material with or without any kind of filler materials.

Referring to FIG. 1, there is shown a schematic top view representation of an electronic device according to an embodiment. The electronic device 10 comprises a carrier 1, a plurality of pins 2, and an electronic circuit comprising a first semiconductor chip 3 and a second semiconductor chip 4. The first semiconductor chip 3 is attached to the carrier 1 and the second semiconductor chip 4 is attached to one of the plurality of pins 2.

An essential advantage of the embodiment according to FIG. 1 is that the first and second semiconductor chips 3 and 4 are arranged such that it becomes possible to dissipate the heat produced therein along different heat dissipation paths. In particular, according to an embodiment, the carrier 1 and the pins 2 are made of a metallic material so that heat produced in the first semiconductor chip 3 can be dissipated by the metal carrier 1 and heat produced in the second semiconductor chip 4 can be dissipated by the metal pin 2. According to a further embodiment one or both of the first and second semiconductor chips 3 and 4 have an electrode contact at their bottom surfaces so that the chip is also electrically contacted to the carrier 1 or pin 2, respectively.

The first semiconductor chip 3 and the second semiconductor chip 4 are part of one and the same electronic circuit of which examples will be detailed further below. This means that an electrical connection like, for example, a wire bond is provided connecting either one of the second semiconductor chip 4 or its supporting pin 2 with one of the first semiconductor chip 3 or its supporting carrier 1. An example thereof will be presented in an embodiment further below.

According to an embodiment of the electronic device of FIG. 1, the metal carrier 1 and the plurality of metal pins 2 were fabricated from a leadframe by any fabrication method known in the art.

According to an embodiment of the electronic device of FIG. 1, the pin 2 which supports the second semiconductor chip 4 comprises an enlarged or widened portion at its one end so that the second semiconductor chip 4 can be securely attached onto the enlarged or widened portion. According to a further embodiment thereof the widened portion and the second semiconductor chip 4 each have rectangular shape, and the length of a side edge of the second semiconductor chip 4 can be in the range 0.5 mm to 1 mm and the length of a side edge of the widened portion can be in the range 1 mm to 4 mm, for example.

According to an embodiment of the electronic device of FIG. 1, the carrier 1 and the plurality of pins 2 are situated in different planes which means that the carrier 1 is formed as a flat plane carrier 1 situated within a first plane and the plurality of pins 2 are situated in a second plane and the first plane and the second plane are separated from each other. It is also possible that at least one of the pins 2 can be bent out of the second plane for reasons which will be explained further below.

According to an embodiment of the electronic device of FIG. 1, the first and second semiconductor chips 3 and 4 are embedded in one and the same insulating material. The outer edge of such an insulating material block 5 is indicated with the dashed line in FIG. 1. The insulating material, for example, can be any sort of encapsulating or mold material applied to the device after attaching the first and second semiconductor chips 3 and 4 to the carrier 1 and the pin 2 and providing wire bonds as will be outlined further below.

According to an embodiment of the electronic device of FIG. 1, the first and second semiconductor chips 3 and 4 are fabricated from different semiconductor base materials. In particular, semiconductor base materials like Si, SiC, GaN, or GaAs can be employed as base materials for the first and second semiconductor chips 3 and 4.

According to an embodiment of the electronic device of FIG. 1, the first and second semiconductor chips 3 and 4 are comprised of power semiconductor chips which, for example, can be power diodes or power transistors.

According to an embodiment of the electronic device of FIG. 1, the electronic circuit is part of a power converter circuit and the first semiconductor chip 3 comprises a power transistor like a power MOSFET and the second semiconductor chip 4 comprises a power diode. In particular the electronic device can be part of a Power Factor Correction (PFC) device.

Referring to FIG. 2, there is shown a schematic cross-sectional side view representation of an electronic device according to an embodiment. The electronic device 20 comprises a first metal carrier 21 and a second metal carrier 22, and an electronic circuit comprising a first semiconductor chip 23 and a second semiconductor chip 24. The first and second metal carriers 21 and 22 are situated in different planes and the first semiconductor chip 23 is attached to the first metal carrier 21 and the second semiconductor chip 24 is attached to the second metal carrier 22.

According to an embodiment of the electronic device of FIG. 2, the second metal carrier 22 is one of a plurality of pins arranged, for example, along a row extending perpendicular to the plane of the sheet.

According to an embodiment of the electronic device of FIG. 2, the first and second semiconductor chips 23 and 24 are mechanically connected with different heat dissipation paths. As already explained in connection with the embodiment of FIG. 1, the heat produced in the first semiconductor chip 23 can be dissipated by the first carrier 21 and the heat produced in the second semiconductor chip 24 can be dissipated by the second metal carrier 22.

According to an embodiment of the electronic device of FIG. 2, the first and second semiconductor chips 23 and 24 are embedded in one and the same insulating material. An outline of the insulating material block 25 is indicated by the dashed line in FIG. 2. According to an embodiment thereof the second metal carrier 22 extends beyond the outline of the insulating material block 25. According to a further embodiment thereof, one of the main surfaces of the first metal carrier 21 is not covered by the insulating material 25 so that, for example, a heat sink can be attached to that main surface of the first metal carrier 21 to further dissipate the heat generated in the first semiconductor chip 23.

Further embodiments of the electronic device of FIG. 2 can be formed or construed along the embodiments or features as described above in connection with the embodiment of FIG. 1.

Referring to FIG. 3, there is shown a schematic cross-sectional side view representation of an electronic device according to an embodiment. The electronic device 30 comprises an electronic circuit comprising a first semiconductor chip 33 and a second semiconductor chip 34, wherein the first and second semiconductor chips 33 and 34 are mechanically connected with different heat dissipation paths as indicated by fat lines 36 and 37 in FIG. 3.

According to an embodiment of the electronic device of FIG. 3, the electronic device 30 further comprises a carrier and a plurality of pins, wherein the first semiconductor chip 33 is attached to the carrier and the second semiconductor chip is attached to one of the plurality of pins. The carrier forms at least part of the first heat dissipation path 36 and the pin forms at least part of the second heat dissipation path 37.

According to an embodiment of the electronic device of FIG. 3, the first and second semiconductor chips 33 and 34 are embedded in one and the same insulating material. The outline of an insulating material block 35 is indicated by the dashed line in FIG. 3.

Further embodiments of the electronic device 30 of FIG. 3 can be formed or construed along the embodiments or features as described above in connection with the embodiments of FIGS. 1 and 2.

Referring to FIG. 4, there is shown a schematic cross-sectional side view representation of an electronic device according to an embodiment. The electronic device 40 comprises an electronic circuit comprising a first power semiconductor chip 43 and a second power semiconductor chip 44, wherein the first and second power semiconductor chips 43 and 44 are embedded in one and the same insulating material. The outline of an insulating material block 45 is indicated by the dashed line in FIG. 4. Moreover, the first and second semiconductor chips 43 and 44 are fabricated from different semiconductor base materials.

According to an embodiment of the electronic device of FIG. 4, the semiconductor base materials are selected from a group of materials comprising Si, SiC, GaN, and GaAs.

According to an embodiment of the electronic device of FIG. 4, the electronic circuit is part of a power converter circuit and the first power semiconductor chip 43 comprises a power transistor, in particular, a power MOSFET, and the second power semiconductor chip 44 comprises a power diode. According to a further embodiment thereof, the power diode is fabricated on the basis of SiC or GaN. According to a further embodiment thereof, the power MOSFET is fabricated on the basis of Si and is configured as a vertical MOSFET. This means that the first power semiconductor chip 43 comprises two main surfaces and a source electrode contact pad and a gate electrode contact pad are arranged on a first main surface and a drain electrode contact pad is arranged on a second main surface of the first power semiconductor chip 43.

Further embodiments of the electronic device 40 of FIG. 4 can be formed or construed along the embodiments or features as were described above in connection with the embodiments of FIGS. 1 to 3.

Referring to FIG. 5, there is shown a schematic cross-sectional side view representation of an electronic device according to an embodiment. The electronic device 50 comprises a first semiconductor chip 53 and a second semiconductor chip 54, the first semiconductor chip 53 comprising a power MOSFET 53.1 and the second semiconductor chip 54 comprising a power diode 54.1, wherein the first semiconductor chip 53 and the second semiconductor chip 54 are embedded in one and the same insulating material. The insulating material is indicated by an insulating material block 55, the outline of which is indicated as a dashed line in FIG. 5.

According to an embodiment of the electronic device of FIG. 5, the first and second semiconductor chips 53 and 54 are mechanically connected with different heat dissipation paths. According to a further embodiment thereof, the first semiconductor chip 53 can be attached to a first carrier and the second semiconductor chip 54 can be attached to a second carrier, wherein the second carrier can be one of a plurality of pins.

According to an embodiment of the electronic device of FIG. 5, the first and second semiconductor chips 53 and 54 are arranged in different planes as shown in FIG. 5.

According to an embodiment of the electronic device of FIG. 5, the power MOSFET is configured as a vertical MOSFET.

Further embodiments of the electronic device of FIG. 5 can be formed or construed along the embodiments or features as described above in connection with the embodiments of FIGS. 1 to 4.

Referring to FIG. 6, there is shown a schematic top view representation of an electronic device according to an embodiment.

The electronic device 60 as shown in FIG. 6 comprises a carrier 61 and a plurality of pins 62. The carrier 61 and the pins 62 were fabricated from a metallic leadframe by anyone of the methods as known in the art. A power MOSFET semiconductor chip 63 is attached to the upper surface of the metal carrier 61. The power MOSFET 63 is configured as a vertical power MOSFET in such a way that on the upper surface of the power MOSFET 63 a gate electrode contact pad 63A and a source electrode contact pad 63B are provided whereas on the lower surface, which is in electrical and thermal contact with the upper surface of the metal carrier 61, a drain electrode contact pad (not shown) is provided. On the upper surface of the power MOSFET 63, onto the area of the source electrode contact pad 63B, a driver circuit chip 68 is arranged. The driver circuit chip 68 comprises on its upper main surface a plurality of contact pads 68A, one of which is connected by a wire bond to the source electrode contact pad 63B of the power MOSFET 63, another one of which is connected by a wire bond with the gate electrode contact pad 63A of the power MOSFET 63, and the other ones of the contact pads 68A are connected by wire bonds to the pins 62, respectively. The source electrode contact pad 63B of the power MOSFET 63 is connected by a thick wire 69 to the right outermost pin 62 which serves as ground of the electrical circuit. The metal carrier 61 and an upper part of the pins 62 are embedded in an insulating material block (not shown) so that a lower part of the pins 62 extend out of the insulating material block and are intended to be inserted to a wireboard as will be shown later.

Figure 9:
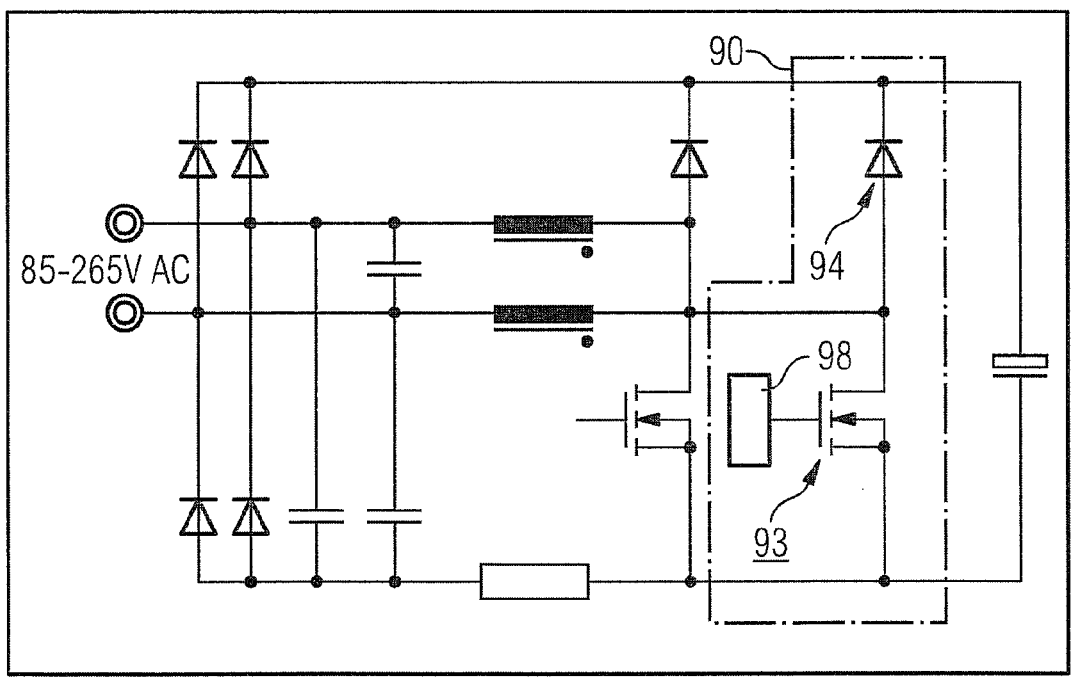
FIG. 9 shows a schematic diagram of a Power Factor Control (PFC) circuitry.

Referring to FIG. 9, there is shown a schematic circuit diagram of a Power Factor Control circuit according to an example. The circuit as shown in FIG. 9 essentially converts an AC voltage as input on the left side into a DC voltage as may be taken out at the right outermost nodes of the circuit. The Power Factor Control circuit as shown in FIG. 9 is as such known in the prior art and will thus not be described here in any further detail. The electronic device as described above in connection with the embodiments of FIGS. 1 to 5 forms part of the Power Factor Control circuit of FIG. 6. In particular, the circuit comprises an electronic device 90 such as that described in the previous embodiments and indicated by the dashed line in FIG. 6. This section shows in the lower part a power MOSFET 93, the gate electrode of which is driven by a driver circuit 98, and the upper part of this section shows a power diode 94. These circuit elements were also shown and described in the embodiment of an electronic circuit as of FIG. 5.

Figure 7B:
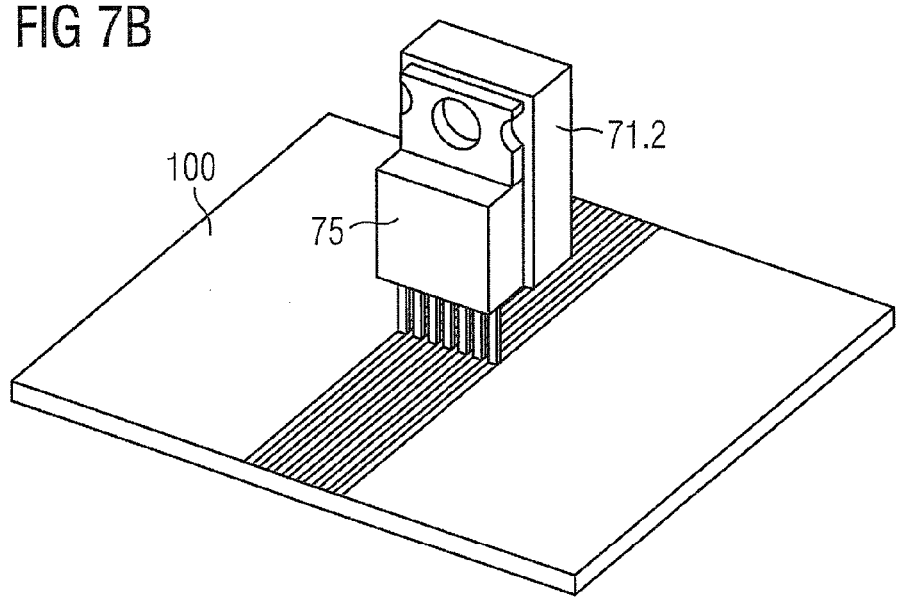

Referring to FIGS. 7A and 7B there are shown perspective views of an electronic circuit according to an embodiment. FIG. 7A shows an electronic device 70 which is essentially a perspective view of the electronic device 60 of FIG. 6 with the only difference that the first carrier 71 comprises an upper extension 71.1 which serves the purpose of holding and attaching a heat sink thereto. FIG. 7B shows again the electronic device 70 in a configuration in which it is inserted into a circuit board 100 by the customer. Moreover, as compared with FIG. 7A, an insulating material block 75 has been formed around the area containing the first and second semiconductor chips. The insulating material block 75, for example, can be formed by molding. A heat sink 71.2 is attached to the rear main surface of the carrier 71 and can be comprised of, for example, a copper block.

Figure 8:
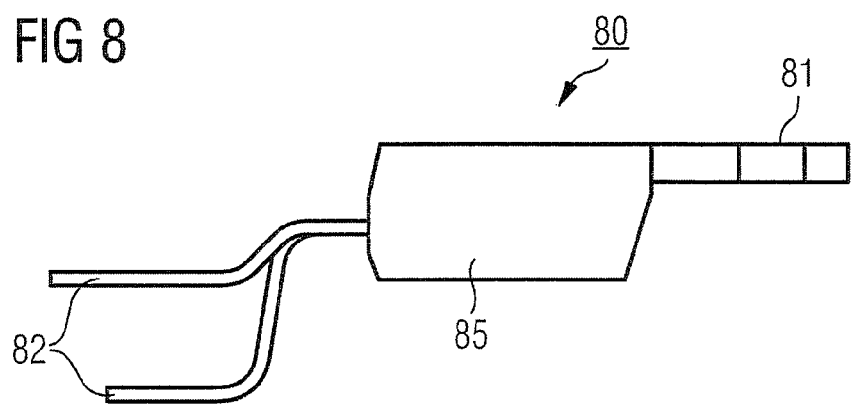
FIG. 8 shows a schematic cross-section side view representation of an electronic device according to an embodiment.

Referring to FIG. 8, there is shown a schematic cross-sectional side view representation of an electronic device according to an embodiment. The electronic device 80 shows a carrier 81 on the right side, in the middle portion an insulating material block 85 and on the left side a plurality of pins 82, wherein only two pins 82 are shown. Whereas in the previous embodiments the pins are always arranged within one and the same plane, the embodiment of FIG. 8 shows that the pins 82 can also be bent according to the customer's requirements and wishes. As shown in FIG. 8, one of the pins 82 is bent downwards so that a vertical distance between the two pins as shown in FIG. 8 is produced. This can be advantageous, in particular, in cases in which these two pins carry very high voltages to be supplied to the electronic device comprising the first and second semiconductor chips.

What is claimed is:

1. An electronic device comprising:
   a carrier;
   a plurality of pins comprising a first pin and a second pin, the first and second pins having the same shape; and
   an electronic circuit comprising a first semiconductor chip and a second semiconductor chip, wherein
   the first semiconductor chip is disposed on the carrier and the second semiconductor chip disposed on the first pin, and wherein
   the second semiconductor chip includes an electrode in direct contact with the first pin.

2. The electronic device according to claim 1, wherein the carrier and the plurality of pins are situated in different planes.

3. The electronic device according to claim 1, wherein the first and second semiconductor chips are embedded in an insulating material.

4. The electronic device according to claim 1, wherein the first semiconductor chip comprises a first semiconductor base material, wherein the second semiconductor chip comprises a second semiconductor base material, and wherein the first and second semiconductor base materials are different.

5. The electronic device according to claim 1, wherein the first and second semiconductor chips comprise power semiconductor chips.

6. The electronic device according to claim 1, wherein the electronic circuit comprises a power converter circuit and the first semiconductor chip comprises a power transistor and the second semiconductor chip comprises a power diode.

7. An electronic device comprising:
   a carrier;
   a plurality of pins; and
   an electronic circuit comprising a first semiconductor chip and a second semiconductor chip, wherein the first semiconductor chip is disposed on the carrier and the second semiconductor chip is disposed on one of the plurality of pins, the first semiconductor chip is connected to a first heat dissipation path and the second chip is connected to a second heat dissipation path, and wherein the second semiconductor chip includes an electrode in direct contact with the one of the plurality of pins.

8. The electronic device according to claim 7, further comprising a molding compound encapsulating the first and second semiconductor chips.

9. The electronic device according to claim 7, wherein the first semiconductor chip comprises a first semiconductor base material selected from the group consisting of Si, SiC, GaN and GaAs, wherein the second semiconductor chip comprises a second semiconductor base material selected from the group consisting of Si, SiC, GaN and GaAs, and wherein the first and second semiconductor base materials are different.

10. The electronic device according to claim 7, first semiconductor chip comprises a power MOSFET and the second semiconductor chip comprises a power diode.

11. The electronic device according to claim 7, wherein the one of the plurality of pins is enlarged relative to others of the plurality of pins.

12. An electronic device comprising:
    a carrier;
    a pin;
    a first semiconductor chip comprising a first semiconductor material;
    a second semiconductor chip comprising a second semiconductor material, the second semiconductor chip disposed on the pin; and
    an encapsulation body encapsulating the first and the second semiconductor chips,
    wherein the first semiconductor material is different than the second semiconductor material, and wherein the second semiconductor chip includes an electrode in direct contact with the pin.

13. The electronic device according to claim 12, wherein the first and second semiconductor materials comprise a material from the group consisting of Si, SiC, GaN, and GaAs.

14. The electronic device according to claim 12, wherein the first semiconductor chip comprises a power MOSFET and the second semiconductor chip comprises a power diode.

15. The electronic device according to claim 14, wherein the power diode comprises SiC or GaN.

16. The electronic device according to claim 15, wherein the power MOSFET is a vertical power MOSFET and wherein the vertical power MOSFET comprises Si.

17. An electronic device comprising:
    a carrier;
    a plurality of pins;
    a first semiconductor chip disposed on the carrier;
    a second semiconductor chip disposed on the first semiconductor chip;
    a third semiconductor chip disposed on a first pin of the plurality of pins; and
    an encapsulation material encapsulating the first, second and third semiconductor chips, wherein
    the third semiconductor chip includes an electrode in direct contact with the first pin.

18. The electronic device according to claim 17, wherein the first semiconductor chip is a power MOSFET, wherein the second semiconductor chip is a driver circuit chip, and wherein the third semiconductor chip is a power diode.

19. The electronic device according to claim 17, wherein the first semiconductor chip comprises a gate contact, a first source/drain contact and a second source/drain contact, wherein the gate contact is electrically connected to the second semiconductor chip, wherein the first source/drain contact is electrically connected to the third semiconductor chip, and wherein the second source/drain contact is electrically connected to a second pin of the plurality of pins.

20. The electronic device according to claim 19, wherein the electrical connection of the second source/drain contact to the second pin is thicker than the electrical connection of the first source/drain contact to the third semiconductor chip and the electrical connection of the gate contact to the second semiconductor chip, and wherein the electrical connection of the first source/drain contact to the third semiconductor chip is thicker than the electrical connection of the gate contact to the second semiconductor chip.

21. The electronic device according to claim 19, wherein the second semiconductor comprises a driver circuit chip and wherein contacts of the driver circuit chip are connected to more than one of the remaining pins of the plurality of pins.

22. The electronic device according to claim 17, wherein the first semiconductor chip and the third semiconductor chip are arranged in different planes.

23. The electronic device according to claim 17, further comprising a heat sink disposed under the carrier.

24. An electronic device comprising:
a carrier;
a plurality of pins;
a first semiconductor chip disposed on the carrier, the first semiconductor chip configured to carry a current;
a second semiconductor chip disposed on a first pin of the plurality of pins, the second semiconductor chip configured to carry the current; and an encapsulation material encapsulating the first and second semiconductor chips, wherein
the second semiconductor chip includes an electrode in direct contact with the first pin.

25. The electronic device according to claim 24, wherein the carrier comprises a through hole.

26. The electronic device according to claim 24, wherein the plurality of pins further comprise a second pin, and wherein the first pin and the second pin have the same shape.

27. The electronic device according to claim 26, wherein the first pin and the second pin are outermost pins of the plurality of pins.

* * * * *